United States Patent
Tandingan et al.

(10) Patent No.: US 9,607,695 B1
(45) Date of Patent: Mar. 28, 2017

(54) MULTI-BIT NON-VOLATILE RANDOM-ACCESS MEMORY CELLS

(71) Applicant: Cypress Semiconductor Corporation, San Jose, CA (US)

(72) Inventors: Joseph Tandingan, Colorado Springs, CO (US); Judith Allen, Monument, CO (US); David Still, Colorado Springs, CO (US); Jayant Ashokkumar, Colorado Springs, CO (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 15/079,462

(22) Filed: Mar. 24, 2016

Related U.S. Application Data

(60) Provisional application No. 62/255,000, filed on Nov. 13, 2015.

(51) Int. Cl.
*G11C 14/00* (2006.01)
*G11C 11/419* (2006.01)

(52) U.S. Cl.
CPC ........ *G11C 14/0063* (2013.01); *G11C 11/419* (2013.01); *G11C 14/0054* (2013.01)

(58) Field of Classification Search
CPC .................................................. G11C 14/0063
USPC ..................................................... 365/185.08
See application file for complete search history.

(56) References Cited

U.S. PATENT DOCUMENTS

| | | | |
|---|---|---|---|
| 5,065,362 A * | 11/1991 | Herdt | G11C 14/00 365/154 |
| 6,363,008 B1 | 3/2002 | Wong | |
| 6,414,873 B1 * | 7/2002 | Herdt | G11C 14/00 365/154 |
| 6,855,979 B2 | 2/2005 | Sadd et al. | |
| 6,944,042 B2 | 9/2005 | Komatsuzaki | |
| 6,960,505 B2 | 11/2005 | Hofmann et al. | |
| 7,164,608 B2 * | 1/2007 | Lee | G11C 14/00 365/189.05 |
| 7,433,228 B2 | 10/2008 | Kuo et al. | |

(Continued)

FOREIGN PATENT DOCUMENTS

CN 102610617 A 7/2012

OTHER PUBLICATIONS

Spansion LLC., MirrorBit Quad Technology: The First 4bit-per-cell Flash Memory, Sep. 2006, 8 pages.

*Primary Examiner* — Son Mai

(57) ABSTRACT

Multi-bit non-volatile random access memory cells are disclosed. A multi-bit non-volatile random access memory cell may include a volatile storage element and a non-volatile storage circuit. The non-volatile storage circuit may include at least one first pass transistor connected to a data true (DT) node of the volatile storage element and at least one second pass transistor connected to a data complement (DC) node of the volatile storage element. The non-volatile storage circuit may also include multiple non-volatile storage elements. Each non-volatile storage element may be configured to be selectively connectable to the DT node of the volatile storage element via the at least one first pass transistor and selectively connectable to the DC node of the volatile storage element via the at least one second pass transistor, allowing the multi-bit non-volatile random access memory cell to store/recall more than one databit per cell.

18 Claims, 8 Drawing Sheets

(56) References Cited

U.S. PATENT DOCUMENTS

| | | | |
|---|---|---|---|
| 7,629,640 B2 | 12/2009 | She et al. | |
| 7,710,776 B2* | 5/2010 | Johal | G11C 16/26 365/185.08 |
| 8,331,150 B2* | 12/2012 | Hsu | G11C 14/00 365/185.08 |
| 8,861,271 B1* | 10/2014 | Zain | G11C 8/20 365/154 |
| 8,964,470 B2* | 2/2015 | Lee | G11C 14/0063 365/185.07 |
| 8,976,588 B2* | 3/2015 | Lee | G11C 14/0063 365/185.08 |
| 9,177,644 B2* | 11/2015 | Tsao | G11C 14/0063 |
| 2009/0190402 A1* | 7/2009 | Hsu | G11C 14/00 365/185.08 |

* cited by examiner

US 9,607,695 B1

MULTI-BIT NON-VOLATILE RANDOM-ACCESS MEMORY CELLS

CROSS-REFERENCE TO RELATED APPLICATIONS

The present application claims the benefit under 35 U.S.C. §119(e) of U.S. Provisional Application Ser. No. 62/255,000, filed Nov. 13, 2015. Said U.S. Provisional Application Ser. No. 62/255,000 is hereby incorporated by reference in its entirety.

TECHNICAL FIELD

The present disclosure generally relates to the field of data storage devices, and particularly to non-volatile static random-access memory devices.

BACKGROUND

Non-volatile static random-access memory (nvSRAM) is a type of non-volatile random-access memory. An nvSRAM typically includes multiple nvSRAM cells. An nvSRAM cell typically includes a static random-access memory (SRAM) that is configured to facilitate read and write operations and a non-volatile storage circuit that is configured to facilitate store and recall operations. A store operation, for example, may store data from the SRAM of the nvSRAM cell to the non-volatile storage circuit of the nvSRAM cell. A recall operation, on the other hand, may retrieve data from the non-volatile storage circuit of the nvSRAM cell and load the retrieved data into the SRAM of the nvSRAM cell.

SUMMARY

An embodiment of the present disclosure is directed to an apparatus. The apparatus may include a volatile storage element having a data true (DT) node and a data complement (DC) node. The apparatus may also include a non-volatile storage circuit. The non-volatile storage circuit may include at least one first pass transistor connected to the DT node of the volatile storage element and at least one second pass transistor connected to the DC node of the volatile storage element. The non-volatile storage circuit may further include multiple non-volatile storage elements. Each non-volatile storage element may be configured to be selectively connectable to the DT node of the volatile storage element via the at least one first pass transistor and selectively connectable to the DC node of the volatile storage element via the at least one second pass transistor.

A further embodiment of the present disclosure is directed to a system. The system may include a processor and a non-volatile memory device configured to provide data storage for the processor. The non-volatile memory device may include multiple non-volatile memory cells. Each non-volatile memory cell may include a volatile storage element having a DT node and a DC node. Each non-volatile memory cell may also include a non-volatile storage circuit. The non-volatile storage circuit may include at least one first switching element connected to the DT node of the volatile storage element and at least one second switching element connected to the DC node of the volatile storage element. The non-volatile storage circuit may further include multiple non-volatile storage elements. Each non-volatile storage element may be configured to be selectively connectable to the DT node of the volatile storage element via the at least one first switching element and selectively connectable to the DC node of the volatile storage element via the at least one second switching element.

An additional embodiment of the present disclosure is directed to a method. The method may include establishing a first data storage path between a first non-volatile storage element of a plurality of non-volatile storage elements and a DT node of a volatile storage element; programming the first non-volatile storage element based on data stored in the volatile storage element utilizing the first data storage path; establishing a second data storage path between a second non-volatile storage element of the plurality of non-volatile storage elements and the DT node of the volatile storage element; and programming the second non-volatile storage element based on the data stored in the volatile storage element utilizing the second data storage path.

It is to be understood that both the foregoing general description and the following detailed description are for example and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to multi-bit non-volatile random access memory cells. Multi-bit non-volatile random access memory cells are random access memory cells that are able to store/recall more than one databit per cell.

Figure 1:
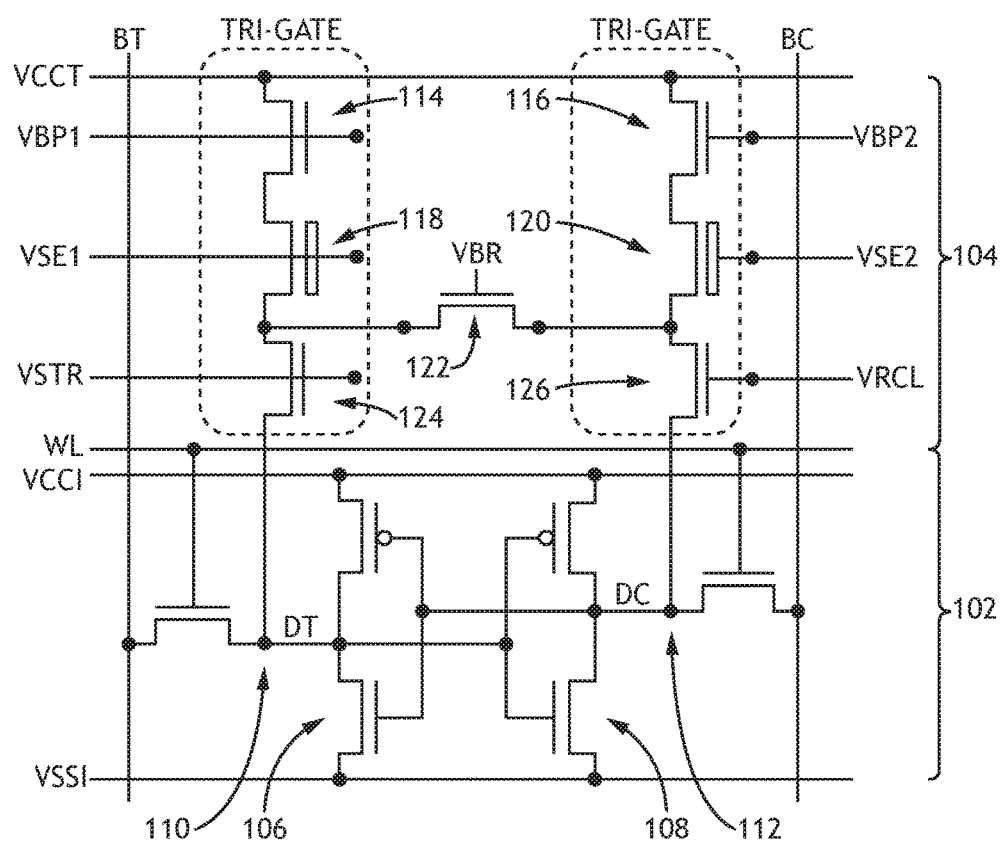
FIG. 1 is a circuit diagram depicting an embodiment of a multi-bit non-volatile random access memory cell.

Referring generally to FIG. 1, a circuit diagram depicting an embodiment of a multi-bit non-volatile random access memory cell 100 configured in accordance with the present disclosure is shown. The multi-bit non-volatile random access memory cell 100 may include a volatile storage element 102 that is configured to facilitate read and write operations. The volatile storage element 102 may be configured utilizing any suitable volatile memory implementations. For instance, as shown in FIG. 1, the volatile storage element 102 may implement a static random access memory (SRAM) that includes a first transistor 106 cross-coupled with a second transistor 108. The volatile storage element 102 may also include a data true (DT) node 110 and a data complement (DC) node 112 connected to the first and second transistors 106 and 108. It is noted that since SRAMs are well understood by those skilled in the art, detailed operations of SRAMs are not repeated in the present disclosure. It is also noted that multi-bit non-volatile random access memory cells 100 utilizing SRAMs as volatile storage elements 102 may be referred to as multi-bit nvSRAM cells 100 for illustrative purposes. It is to be understood, however, that using SRAMs as the volatile storage elements is only for illustrative purposes. It is contemplated that other types of volatile storage elements may be utilized instead of (or in addition to) SRAMs without departing from the spirit and scope of the present disclosure.

The multi-bit non-volatile random access memory cell 100 may also include a non-volatile storage circuit 104 that is configured to facilitate store and recall operations. The non-volatile storage circuit 104 of the multi-bit non-volatile random access memory cell 100 may be isolated from the volatile storage element 102 during read and write operations. The isolation may be achieved by turning off the switching elements (e.g., implemented as pass transistors) 124 and 126 that connect the non-volatile storage circuit 104 to the DT node 110 and the DC node 112. The isolation effectively allows the multi-bit non-volatile random access memory cell 100 to function as a volatile storage element (e.g., an SRAM) for read and write operations.

The non-volatile storage circuit 104 of the multi-bit non-volatile random access memory cell 100 may be used when data in the volatile storage element 102 needs to be stored. This may be referred to as a store operation, which may be triggered automatically (may be referred to as autostore) if the data main voltage source is lost or drops below a threshold value. Alternatively and/or additionally, store operations may be triggered based on certain preconfigured hardware- and/or software-based actions. Regardless of the triggering event, once a store operation is initiated, a series of actions may be performed to carry out the store operation.

In the embodiment depicted in FIG. 1, the non-volatile storage circuit 104 of the multi-bit non-volatile random access memory cell 100 includes a first bulk program transistor 114 and a second bulk program transistor 116 respectively connected to a first non-volatile storage element 118 and a second non-volatile storage element 120. The first non-volatile storage element 118 and the second non-volatile storage element 120 each include a storage device capable of trapping a charge (e.g., a silicon oxide nitride oxide silicon (SONOS) transistor, a floating gate, or the like). The first non-volatile storage element 118 and the second non-volatile storage element 120 are bridged together via a bridge transistor 122. The bridge transistor 122 is configured to selectively connect one of the first or the second non-volatile storage element 118/120 to one of a DT node pass transistor 124 or a DC node pass transistor 126 shared by the first and the second non-volatile storage element 118 and 120. The ability to selectively connect one of the first or the second non-volatile storage element 118/120 to one of the DT node pass transistor 124 or the DC node pass transistor 126 allows the non-volatile storage circuit 104 to selectively store data to (and recall data from) the two non-volatile storage elements 118 and 120, which in turn provides the multi-bit non-volatile random access memory cell 100 abilities to store/recall two databits per cell.

Figure 2:
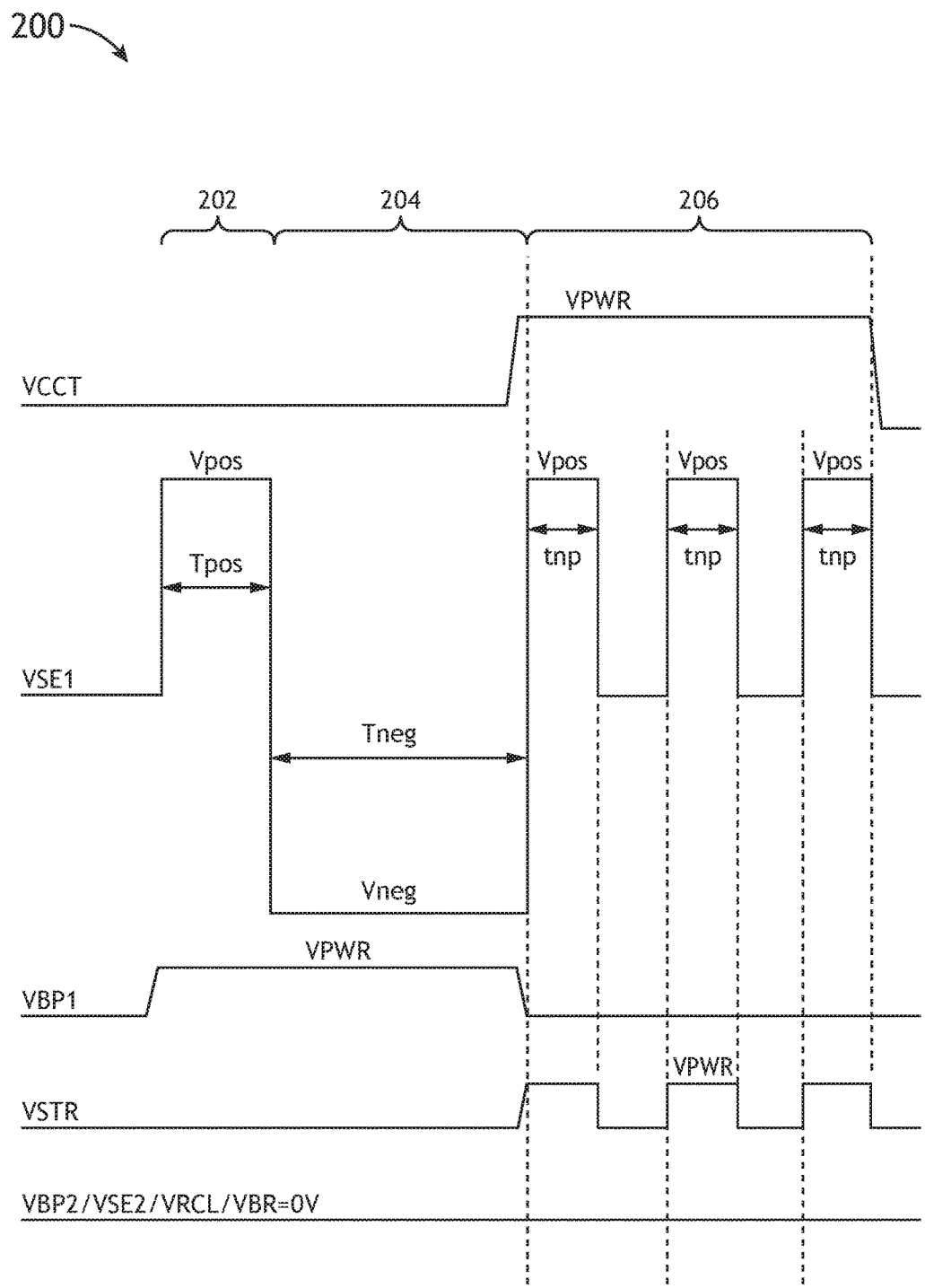
FIG. 2 is a time-based flow diagram depicting an example process performed during a store operation.

FIG. 2 is a time-based flow diagram depicting an example process performed during a store operation 200 for establishing a data storage path to a first non-volatile storage element 118 and storing data to the first non-volatile storage element 118 utilizing the established storage path. Referring generally to FIGS. 1 and 2, a bulk program step 202 is carried out by applying a voltage (VBP1) to the first bulk program transistor 114 and applying a positive voltage (VSE1 being positive) to the first non-volatile storage element 118 for a period of time. A subsequent step, referred to as the bulk erase step 204, may apply a negative voltage (VSE1 being negative) to the first non-volatile storage element 118 for another period of time, erasing the data stored in the non-volatile storage element 118. A program step 206 may commence after the bulk erase step 204. If DT data=1, pass gate VSTR will be "off", and the first non-volatile storage element 118 will remain at "erase" state after the program step 206. If DT data=0, pass gate VSTR will be "on", and the first non-volatile storage element 118 will go to "program" state after the program step 206.

Figure 3:
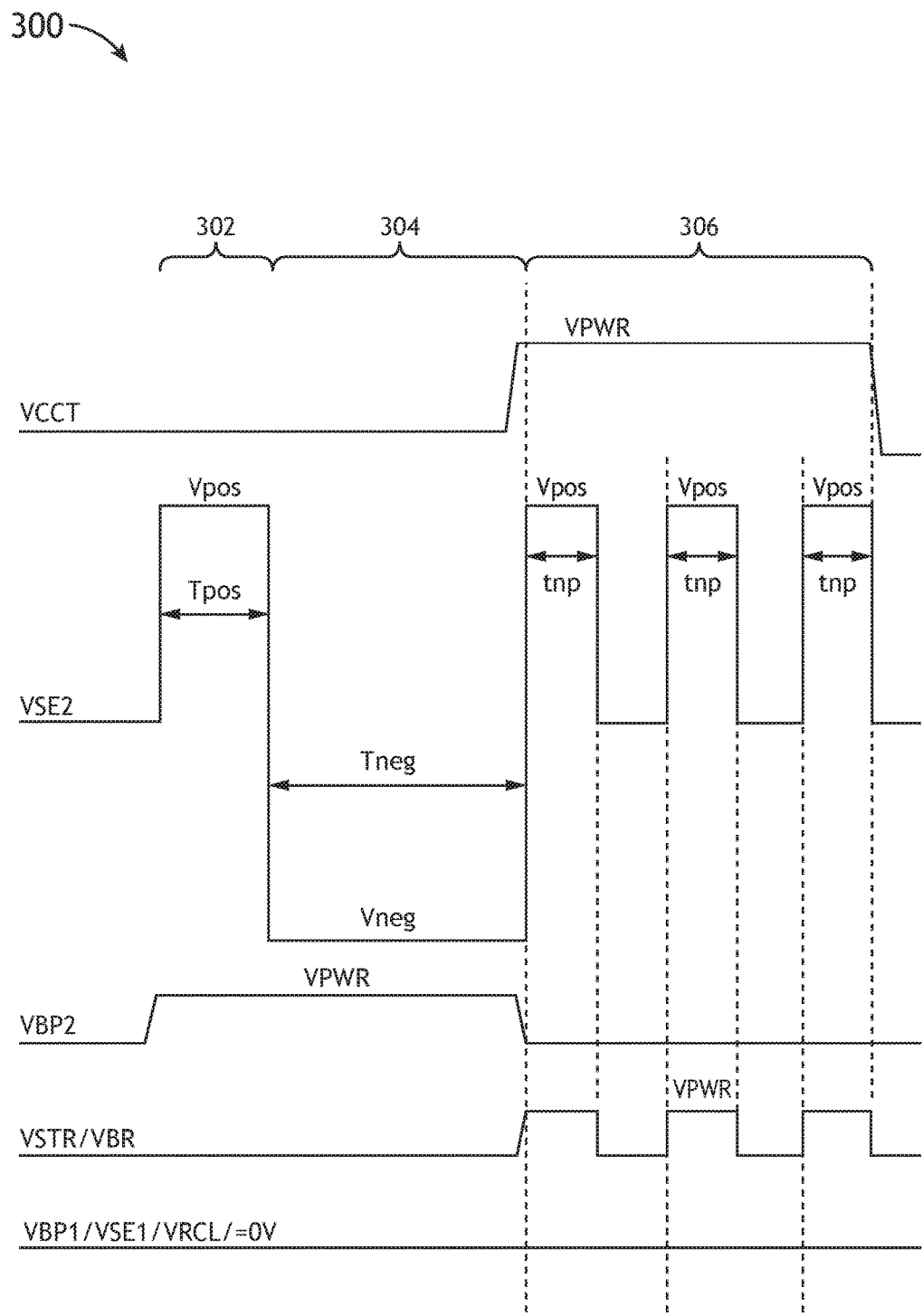
FIG. 3 is another time-based flow diagram depicting an example process performed during a store operation.

FIG. 3 is a time-based flow diagram depicting an example process performed during a store operation 300 for establishing a data storage path to a second non-volatile storage element 120 and storing data to the second non-volatile storage element 120 utilizing the established storage path. Referring generally to FIGS. 1 and 3, a bulk program step 302 is carried out by applying a voltage (VBP2) to the second bulk program transistor 116 and applying a positive voltage (VSE2 being positive) to the second non-volatile storage element 120 for a period of time. A subsequent step, referred to as the bulk erase step 304, may apply a negative voltage (VSE2 being negative) to the second non-volatile storage element 120 for another period of time, erasing the data stored in the non-volatile storage element 120. A program step 306 may commence after the bulk erase step 304. By supplying power (VBR) to the bridge transistor 122, if DT data=1, pass gate VSTR will be "off" and the second non-volatile storage element 120 will remain at "erase" state after the program step 306. If DT data=0, pass gate VSTR will be "on", and the second non-volatile storage element 120 will go to "program" state after the program step 306.

It is noted that the response times of the first and the second non-volatile storage elements 118 and 120 to the voltage applied on VSE1 and VSE2 shown in FIGS. 2 and 3 have been simplified for illustrative purposes. It is to be understood that the response times may not be instantaneous. It is therefore contemplated that pre-charge voltages may be utilized in some implementations to help modify/improve the response times. It is to be understood that whether (and how) such pre-charge voltages are used may vary without departing from the spirit and scope of the present disclosure.

Figure 4:
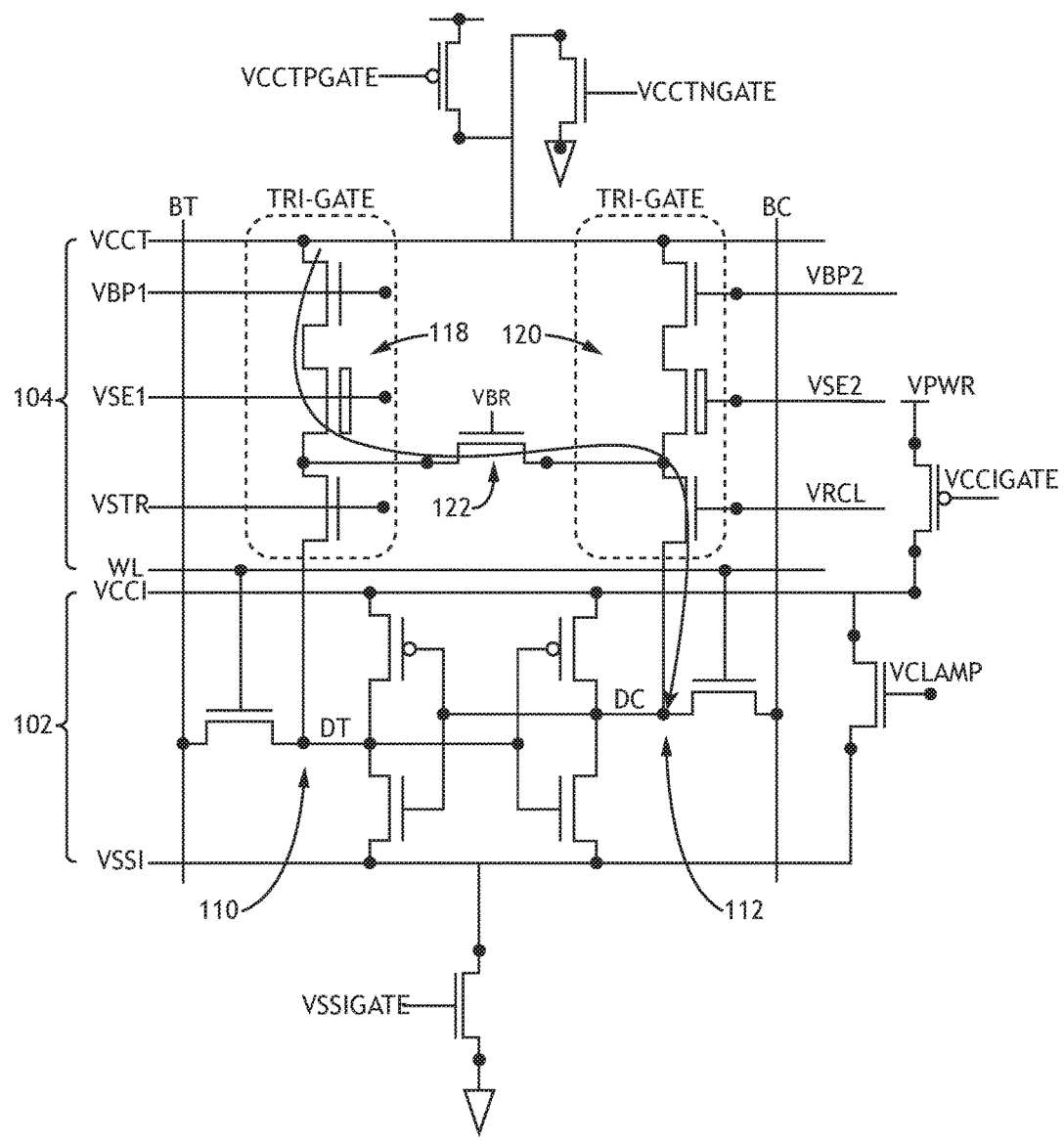
FIG. 4 is a circuit diagram depicting an example process performed during a recall operation.
Figure 5:
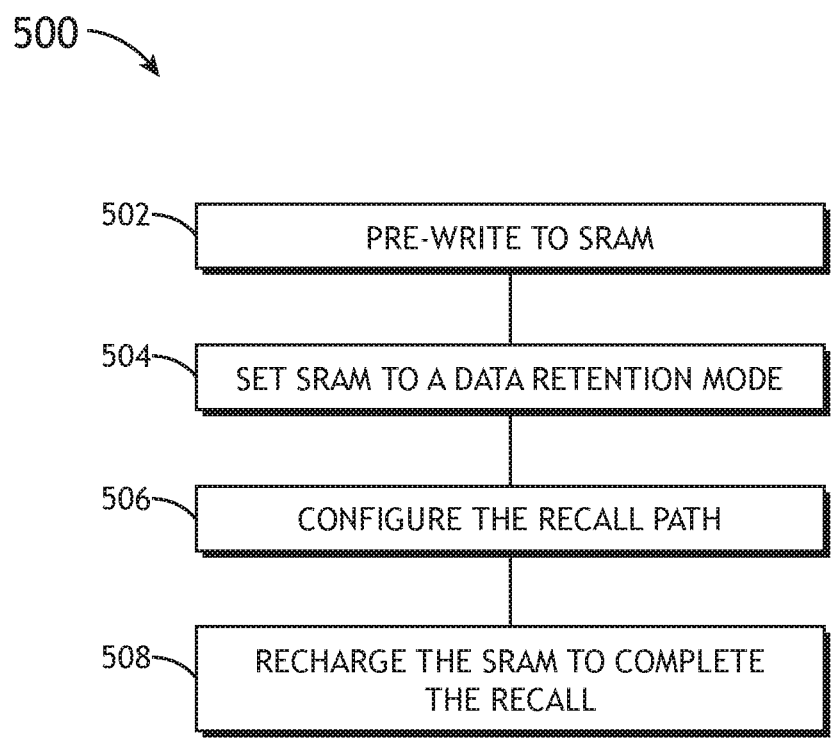
FIG. 5 is a flow diagram depicting the example process performed during the recall operation.

It is noted that the non-volatile storage circuit 104 of the multi-bit non-volatile random access memory cell 100 configured in accordance with the present disclosure also supports recall operations from the two non-volatile storage elements 118 and 120. FIGS. 4 and 5 are illustrations depicting an example process performed during a recall operation 500 for recalling data stored in the first non-volatile storage element 118 into the volatile storage element 102 of the multi-bit non-volatile random access memory cell 100.

More specifically, as shown in FIGS. 4 and 5, a pre-write step 502 may be utilized to write "0"s into the volatile storage element 102 of the multi-bit non-volatile random access memory cell 100, effectively setting the DT node 110 to 0 and the DC node 112 to power. Step 504 may then set the volatile storage element 102 to a data retention mode by turning on the VCLAMP and applying a current limit to the volatile storage element 102 using the VSSIGATE. A recall path may then be established in a recall step 506. To recall data from the first non-volatile storage element 118 (as shown in FIG. 4 for illustrative purposes), the recall step 506 may turn on VRCL, VBP1, VBR, and turn off VSTR and VBP2, effectively establishing the recall path VCCT, VBP1, VSE1, VBR, VRCL, and the DC node 112 of the volatile storage element 102. To recall data from the second non-volatile storage element 120, the recall step 506 may turn on VRCL, VBP2, and turn off VSTR, VBP1 and VBR, effectively establishing the recall path VCCT, VBP2, VSE2, VRCL, and the DC node 112 of the volatile storage element 102.

Once the appropriate recall path is established, a recharge step 508 may recharge the volatile storage element 102 of the multi-bit non-volatile random access memory cell 100 so that the volatile storage element 102 may latch to the data on the recall path. For instance, the recharge step 508 may unclamp VCCI and VSSI and apply VSSI to the volatile storage element 102, allowing the volatile storage element 102 to latch to the data on the recall path and complete the recall operation. In this manner, if the non-volatile storage element 118/120 on the recall path is in an erase state (stored data=1), the DC node 112 of the volatile storage element 102 will be pulled to ground and the DT node 110 of the volatile storage element 102 will be set to 1 at the completion of the recall operation. On the other hand, if the non-volatile storage element 118/120 on the recall path is in a program state (stored data=0), the DC node 112 of the volatile storage element 102 will have no path to be pulled down to ground and the DT node 110 of the volatile storage element 102 will therefore remain the same at the pre-write value of 0, accomplishing the recall operation as intended.

It is noted that the multi-bit non-volatile random access memory cell 100 configured in accordance with the present disclosure is not only able to selectively store data to the non-volatile storage elements 118 and/or 120, but also able to selectively recall data from the non-volatile storage elements 118 and/or 120. It is noted that this ability may help provide several performance improvements over conventional nvSRAM cells that are limited to store/recall one databit per cell. For example, in certain implementations, the non-volatile storage elements 118 and 120 may be used alternately for data storage to help increase the endurance of the multi-bit non-volatile random access memory cell 100. In another example, one of the non-volatile storage elements 118 or 120 may be dedicated as the non-volatile storage element for data storage when power goes down (e.g., providing autostore if the data main voltage source drops below a threshold value) while the other non-volatile storage element may be used to store data when the power is on, effectively improving the robustness of data retention provided by the multi-bit non-volatile random access memory cell 100.

Additionally and/or alternatively, the non-volatile storage elements 118 and 120 may be utilized to provide redundancy that may be appreciated in certain operating conditions. For example, one of the non-volatile storage elements 118 or 120 may be used as a redundant element if the multi-bit non-volatile random access memory cell 100 fails to recall from the other non-volatile storage element. Furthermore, it is noted that the multi-bit non-volatile random access memory cell 100 configured in accordance with the present disclosure is able to provide non-inverted recalls, where after recalling from the non-volatile storage circuit 104 of the multi-bit non-volatile random access memory cell 100, the data in the volatile storage element 102 of the multi-bit non-volatile random access memory cell 100 is the same as the data in the non-volatile storage circuit 104.

It is to be understood that the configuration of the multi-bit non-volatile random access memory cell 100 described above is merely for example and is not meant to be limiting. It is contemplated that alternative configurations may be utilized to implement the multi-bit non-volatile random access memory cell and provide the aforementioned performance improvements without departing from the spirit and scope of the present disclosure. For instance, FIG. 6 is a circuit diagram depicting an embodiment of another multi-bit non-volatile random access memory cell 600 configured in accordance with the present disclosure.

Figure 6:
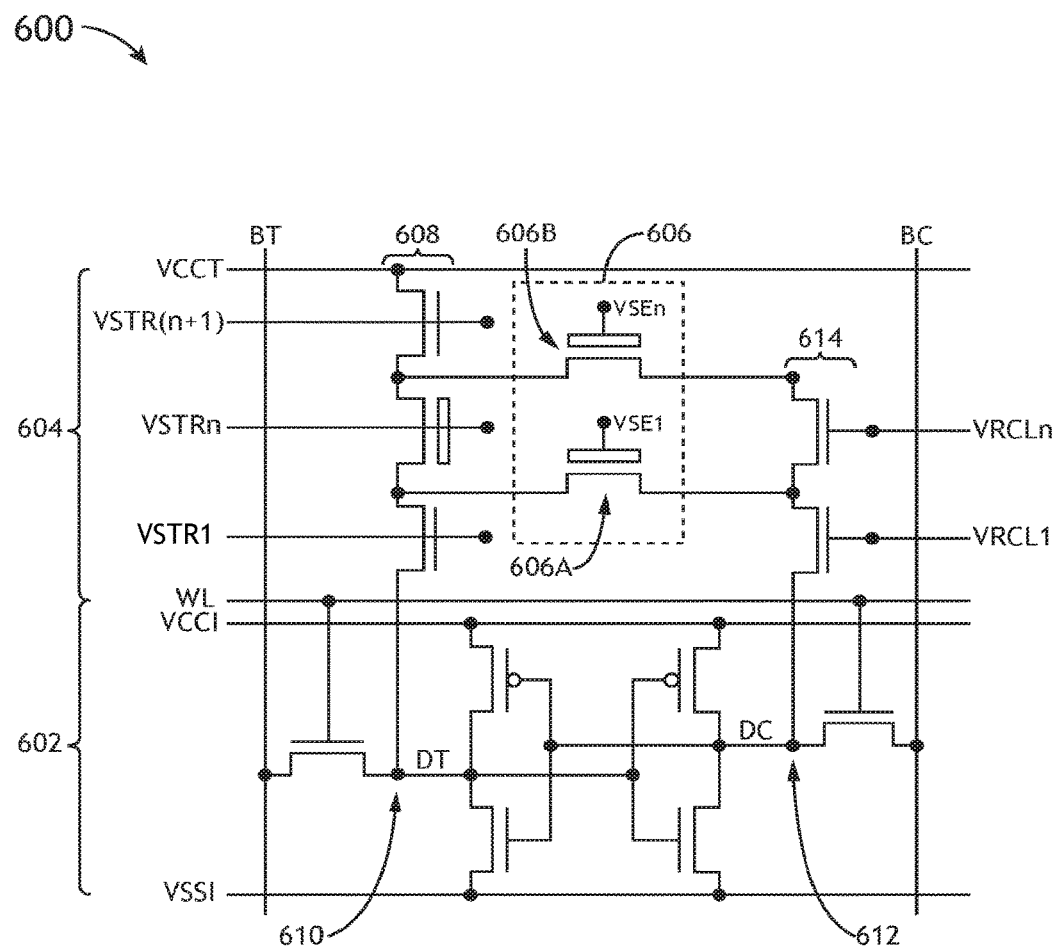
FIG. 6 is a circuit diagram depicting an embodiment of another multi-bit non-volatile random access memory cell.

As shown in FIG. 6, the multi-bit non-volatile random access memory cell 600 includes a volatile storage element (e.g., an SRAM) 602 that is configured to facilitate read and write operations and a non-volatile storage circuit 604 that is configured to facilitate store and recall operations. It is noted that the non-volatile storage circuit 604 of the multi-bit non-volatile random access memory cell 600 may be configured differently compared to the non-volatile storage circuit 104 previously described. The non-volatile storage circuit 604 depicted in FIG. 6 may be configured to support n-number of non-volatile storage elements 606 (where n>2), allowing the multi-bit non-volatile random access memory cell 600 to store/recall up to n-number of databits per cell.

More specifically, the non-volatile storage circuit 604 may include a first group of serially connected switching elements (e.g., pass transistors) 608 connected to the DT node 610 of the volatile storage element 602. The non-volatile storage circuit 604 also may include a second group of serially connected switching elements (e.g., pass transistors) 614 connected to the DC node 612 of the volatile storage element 602. The first group of pass transistors 608 and the second group of pass transistors 614 may be jointly connected to the n-number of non-volatile storage elements 606 to form a ladder network of transistors as shown in FIG. 6. This ladder network of transistors may provide the ability for the multi-bit non-volatile random access memory cell 600 to selectively connect one of the n-number of non-volatile storage elements 606 to the DT node 610 or the DC node 612 of the volatile storage element 602, effectively allowing the multi-bit non-volatile random access memory cell 600 to store/recall up to n-number of databits per cell.

For instance, to store data to a non-volatile storage element 606A (one of the n-number of non-volatile storage elements 606), the multi-bit non-volatile random access memory cell 600 may turn on VSTR(n+1) and VSTRn, turn off VSTR1, VRCL1, VRCLn, and perform the aforementioned bulk program and bulk erase steps on the non-volatile storage element 606A by applying a positive voltage and a negative voltage on VSE1, respectively. The multi-bit non-volatile random access memory cell 600 may then turn off VSTR(n+1) and VSTRn, turn on VSTR1, and perform the aforementioned program step to enable data transfer from the DT node 610 to the non-volatile storage element 606A.

To recall data from the non-volatile storage element 606A, the multi-bit non-volatile random access memory cell 600 may turn on VSTR(n+1), VSTRn, and VRCL1, effectively establishing a recall path from the non-volatile storage element 606A to the DC node 612 of the volatile storage element 602. The volatile storage element 602 may then be recharged and latched to the data on the recall path (the data from the non-volatile storage element 606A in this example), accomplishing the recall operation as intended.

Similarly, to store data to the non-volatile storage element 606B, the multi-bit non-volatile random access memory cell 600 may turn on VSTR(n+1), turn off VSTR1 through VSTRn, VRCL1, VRCLn, and perform the aforementioned bulk program and bulk erase steps on the non-volatile storage element 606B. The multi-bit non-volatile random access memory cell 600 may then turn off VSTR(n+1), turn on VSTR1 through VSTRn, and perform the aforementioned program step to enable data transfer from the DT node 610 to the non-volatile storage element 606B. To recall data from the non-volatile storage element 606B, the multi-bit non-volatile random access memory cell 600 may turn on VSTR(n+1) and VRCL1 through VRCLn, effectively establishing a recall path from the non-volatile storage element 606B to the DC node 612 of the volatile storage element 602.

It is to be understood that while only two non-volatile storage elements 606 are shown in FIG. 6, such a configuration is merely for example and is not meant to be limiting. It is contemplated that a multi-bit non-volatile random access memory cell 600 may include any number of non-volatile storage elements 606 without departing from the spirit and scope of the present disclosure, and that data may be stored to and recalled from the non-volatile storage elements 606 in manners similar to that described above.

Figure 7:
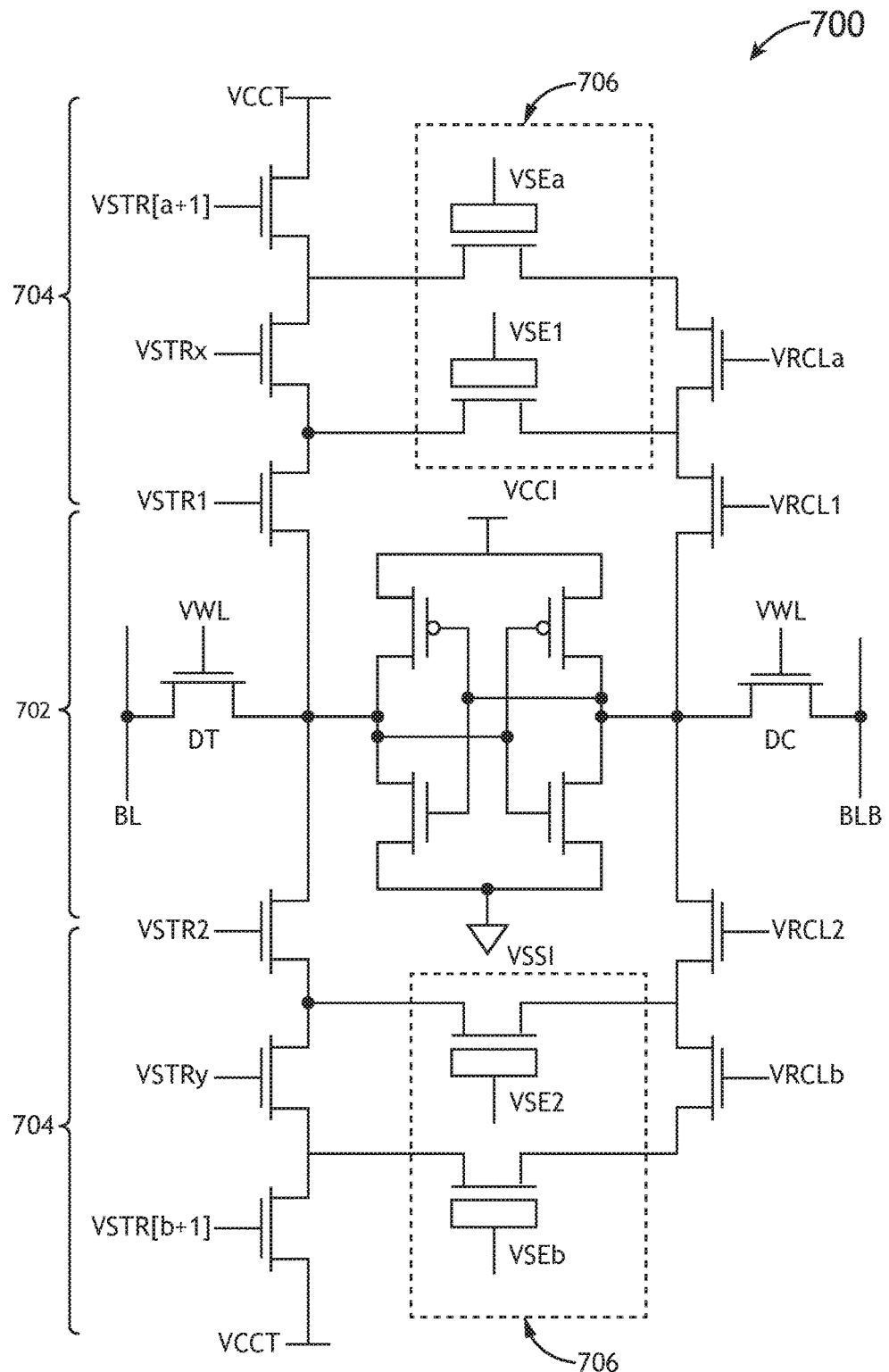
FIG. 7 is a circuit diagram depicting an embodiment of another multi-bit non-volatile random access memory cell.

It is also to be understood that while the n-number of non-volatile storage elements 606 (and the ladder network of transistors in general) are shown to be positioned on one side of the volatile storage element 602, such a configuration is merely for example and is not meant to be limiting. It is contemplated that the n-number of non-volatile storage elements 606 (and the ladder network of transistors in general) may be distributed on more than one side of the volatile storage element 602 without departing from the spirit and scope of the present disclosure. In certain implementations, as shown in FIG. 7, if n is an even number, the non-volatile storage elements 706 (and the ladder network of transistors 704 in general) may be symmetrically distributed on two opposite sides of the volatile storage element 702 to provide a balanced cell structure 700.

It is to be understood that the various circuit diagrams presented above do not necessarily need to correspond to the physical layout of the multi-bit non-volatile random access memory cells. In other words, the physical layout of the multi-bit non-volatile random access memory cells may vary without departing from the spirit and scope of the present disclosure. In certain implementations, the size of the multi-bit non-volatile random access memory cells may be approximately 1.36 micrometers wide and 5.24 micrometers long. It is contemplated, however, that the size of the multi-bit non-volatile random access memory cells may vary without departing from the spirit and scope of the present disclosure.

Figure 8:
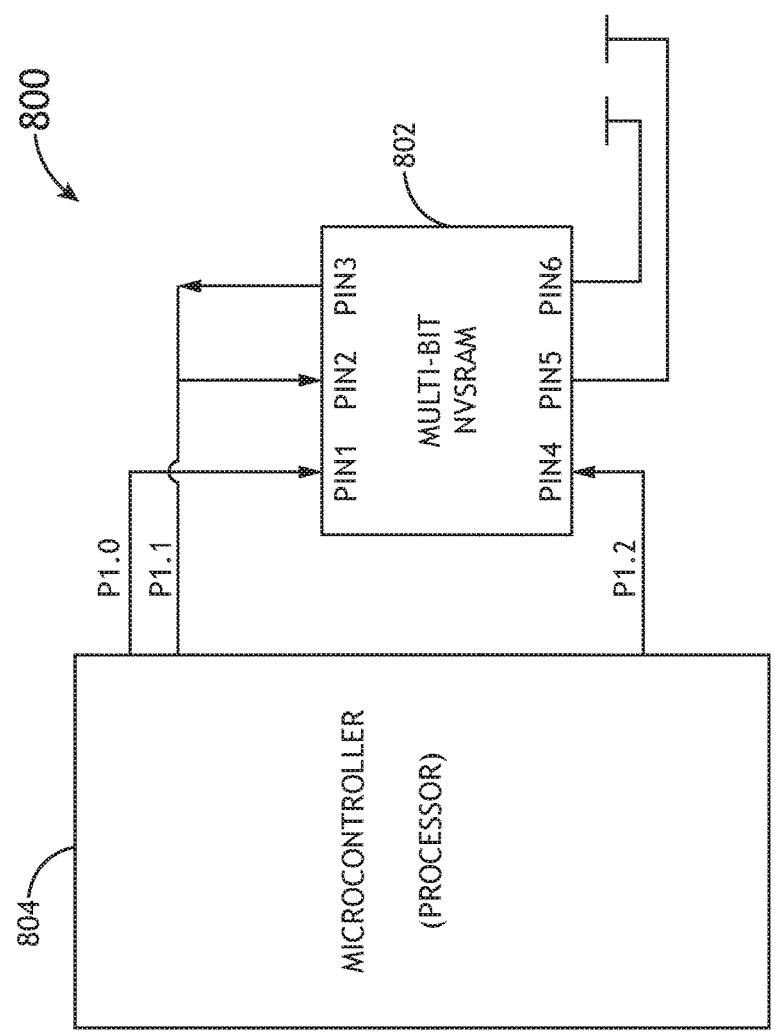
FIG. 8 is a block diagram depicting a system utilizing an embodiment of a multi-bit non-volatile random access memory.

FIG. 8 is a block diagram depicting a system 800 utilizing a multi-bit non-volatile random access memory 802 configured in accordance with the present disclosure. The system 800 may include one or more microcontrollers (may also be referred to as processors) 804 communicatively coupled to the multi-bit non-volatile random access memory 802. The multi-bit non-volatile random access memory 802 may include one or more multi-bit non-volatile random access memory cells configured in accordance with the present disclosure. The one or more multi-bit non-volatile random access memory cells in the multi-bit non-volatile random access memory 802 may be utilized to provide data logging and data storage for the one or more processors 804.

It is to be understood that the present disclosure may be conveniently implemented in forms of a software, hardware, or firmware package. It is also to be understood that embodiments of the present disclosure are not limited to any underlying implementing technology. Embodiments of the present disclosure may be implemented utilizing any combination of software and hardware technology and by using a variety of technologies without departing from the present disclosure or without sacrificing all of their material advantages.

It is to be understood that the specific order or hierarchy of steps in the processes disclosed is but one example. It is to be understood that the specific order or hierarchy of steps in the processes may be rearranged while remaining within the broad scope of the present disclosure. The accompanying method claims present elements of the various steps in a sample order, and are not meant to be limited to the specific order or hierarchy presented.

It is believed that the systems and methods disclosed herein and many of their attendant advantages will be understood by the foregoing description, and it will be apparent that various changes may be made in the form, construction, and arrangement of the components thereof without departing from the broad scope of the present disclosure or without sacrificing all of their material advantages. The form herein before described being merely an explanatory embodiment thereof, it is the intention of the following claims to encompass and include such changes.

The above description is intended to be illustrative, and not restrictive. For example, the above-described embodiments (or one or more aspects thereof) may be used in combination with each other. Other embodiments will be apparent to those of skill in the art upon reviewing the above description. In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document supersedes the usage in any incorporated references.

Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense. The scope of the claims should be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. §1.72(b), requiring an abstract that will allow the reader to quickly ascertain the nature of the technical dis-

What is claimed is:

1. An apparatus, comprising:
a volatile storage element, the volatile storage element comprising a data true (DT) node and a data complement (DC) node; and
a non-volatile storage circuit, the non-volatile storage circuit comprising at least one first pass transistor connected to the DT node of the volatile storage element and at least one second pass transistor connected to the DC node of the volatile storage element, the non-volatile storage circuit further comprising a plurality of non-volatile storage elements, each non-volatile storage element of the plurality of non-volatile storage elements configured to be selectively connectable to the DT node of the volatile storage element via the at least one first pass transistor and selectively connectable to the DC node of the volatile storage element via the at least one second pass transistor, the non-volatile storage circuit further comprising a bridge transistor connected to two non-volatile storage elements, of the plurality of non-volatile storage elements, the bridge transistor configured to selectively connect one of the two non-volatile storage elements to the DT node of the volatile storage element via the at least one first pass transistor and the DC node of the volatile storage element via at least one second pass transistor.

2. The apparatus of claim 1, wherein the at least one first pass transistor comprises a first group of pass transistors connected in series to the DT node of the volatile storage element, the at least one second pass transistor comprises a second group of pass transistors connected in series to the DC node of the volatile storage element, and the plurality of non-volatile storage elements comprises at least two non-volatile storage elements connected to the first group of pass transistors and the second group of pass transistors to form a ladder network of transistors.

3. The apparatus of claim 2, wherein the volatile storage element comprises a static random access memory (SRAM) and wherein the ladder network of transistors is distributed on at least two sides of the SRAM.

4. The apparatus of claim 3, wherein the ladder network of transistors is distributed symmetrically on two opposite sides of the SRAM.

5. The apparatus of claim 1, wherein the plurality of non-volatile storage elements comprises a plurality of silicon oxide nitride oxide silicon (SONOS) transistors.

6. The apparatus of claim 1, wherein the non-volatile storage circuit is configured to store a databit from the volatile storage element into at least two of the plurality of non-volatile storage elements to provide data redundancy for the non-volatile storage circuit.

7. The apparatus of claim 1, wherein the non-volatile storage circuit is configured to store a databit from the volatile storage element into a first one of the plurality of non-volatile storage elements when the apparatus is powered, and the non-volatile storage circuit is further configured to store the databit from the volatile storage element into a second one of the plurality of non-volatile storage elements when the apparatus loses power.

8. The apparatus of claim 1, wherein the non-volatile storage circuit is configured to alternate data storage among the plurality of non-volatile storage elements to increase endurance of the non-volatile storage circuit.

9. A system, comprising:
a processor; and
a non-volatile memory device configured to provide data storage for the processor, the non-volatile memory device comprising a plurality of non-volatile memory cells, each non-volatile memory cell of the plurality of non-volatile memory cells comprising:
a volatile storage element, the volatile storage element comprising a data true (DT) node and a data complement (DC) node; and
a non-volatile storage circuit, the non-volatile storage circuit comprising at least one first switching element connected to the DT node of the volatile storage element and at least one second switching element connected to the DC node of the volatile storage element, the non-volatile storage circuit further comprising a plurality of non-volatile storage elements, each non-volatile storage element of the plurality of non-volatile storage elements configured to be selectively connectable to the DT node of the volatile storage element via the at least one first switching element and selectively connectable to the DC node of the volatile storage element via the at least one second switching element the non-volatile storage circuit further comprising a bridge element connected to two non-volatile storage elements, of the plurality of non-volatile storage elements, the bridge element configured to selectively connect one of the two non-volatile storage elements to the DT node of the volatile storage element via the at least one first switching element and the DC node of the volatile storage element via at least one second switching element.

10. The system of claim 9, wherein the at least one first switching element comprises a first group of switching elements connected in series to the DT node of the volatile storage element, the at least one second switching element comprises a second group of switching elements connected in series to the DC node of the volatile storage element, and the plurality of non-volatile storage elements comprises at least two non-volatile storage elements connected to the first group of switching elements and the second group of switching elements to form a ladder network.

11. The system of claim 10, wherein the ladder network is distributed on at least two sides of the volatile storage element.

12. The system of claim 9, wherein the volatile storage element comprises a static random access memory (SRAM) and the plurality of non-volatile storage elements comprises a plurality of silicon oxide nitride oxide silicon (SONOS) transistors.

13. The system of claim 9, wherein the non-volatile storage circuit is configured to store a databit from the volatile storage element into at least two of the plurality of non-volatile storage elements to provide data redundancy for the particular non-volatile memory cell.

14. The system of claim 9, wherein the non-volatile storage circuit is configured to store a databit from the volatile storage element into a first one of the plurality of non-volatile storage elements when the particular non-volatile memory cell is powered, and the non-volatile storage circuit is further configured to store the databit from the volatile storage element into a second one of the plurality of non-volatile storage elements when the particular non-volatile memory cell loses power.

15. The system of claim 9, wherein the non-volatile storage circuit is configured to alternate data storage among the plurality of non-volatile storage elements to increase endurance of the particular non-volatile memory cell.

16. A method, comprising:
  establishing a first data storage path between a first non-volatile storage element of a plurality of non-volatile storage elements and a data true (DT) node of a volatile storage element;
  programming the first non-volatile storage element based on data stored in the volatile storage element utilizing the first data storage path;
  establishing a second data storage path between a second non-volatile storage element of the plurality of non-volatile storage elements and the DT node of the volatile storage element; and
  programming the second non-volatile storage element based on the data stored in the volatile storage element utilizing the second data storage path.

17. The method of claim 16, wherein the second data storage path and the first data storage path share at least one common pass transistor connected to the DT node of the volatile storage element.

18. The method of claim 16, further comprising:
  establishing a first recall path between the first non-volatile storage element of the plurality of non-volatile storage elements and a data complement (DC) node of the volatile storage element;
  recalling data from the first non-volatile storage element to the volatile storage element utilizing the first recall path;
  establishing a second recall path between the second non-volatile storage element of the plurality of non-volatile storage elements and the DC node of the volatile storage element; and
  recalling data from the second non-volatile storage element to the volatile storage element utilizing the second data storage path.

* * * * *